US 9,653,375 B2
United States Patent
Kawaguchi

(10) Patent No.: US 9,653,375 B2
(45) Date of Patent: May 16, 2017

(54) VEHICULAR POWER CONVERSION DEVICE

(71) Applicant: Takayuki Kawaguchi, Tokyo (JP)

(72) Inventor: Takayuki Kawaguchi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/764,964

(22) PCT Filed: Mar. 26, 2013

(86) PCT No.: PCT/JP2013/058853
§ 371 (c)(1),
(2) Date: Jul. 30, 2015

(87) PCT Pub. No.: WO2014/155542
PCT Pub. Date: Oct. 2, 2014

(65) Prior Publication Data
US 2015/0371920 A1 Dec. 24, 2015

(51) Int. Cl.
*H01L 23/367* (2006.01)
*H05K 7/20* (2006.01)
(Continued)

(52) U.S. Cl.
CPC .......... *H01L 23/3672* (2013.01); *B61C 17/00* (2013.01); *B61C 17/04* (2013.01);
(Continued)

(58) Field of Classification Search
CPC .............. H01L 23/3672; H01L 23/467; H01L 2924/0002; H01L 2924/00; H01L 23/473;
(Continued)

(56) References Cited

U.S. PATENT DOCUMENTS

| 4,535,386 A * | 8/1985 | Frey, Jr. ................ H05K 7/206 165/104.33 |
| 2003/0066634 A1 * | 4/2003 | Valenzuela ............... F28F 3/02 165/148 |

(Continued)

FOREIGN PATENT DOCUMENTS

| JP | 2000092819 A | 3/2000 |
| JP | 2001-74349 A | 3/2001 |

(Continued)

OTHER PUBLICATIONS

Office Action issued Dec. 8, 2016 by the German Patent Office in corresponding German Patent Application No. 11 2013 006 883.4, with an English translation thereof (28 pages).

(Continued)

*Primary Examiner* — Adam B Dravininkas
(74) *Attorney, Agent, or Firm* — Buchanan Ingersoll & Rooney PC

(57) ABSTRACT

Semiconductor elements work for power conversion and generate heat. A plurality of heat-radiating fins are juxtaposed at intervals to form a passage in a first axis direction, receive the heat from the semiconductor elements, and expel the heat into the air flowing through the passage. A first protective fin has an end face having an equal length in the juxtaposition direction to and mutually facing the end face on the first axis positive side of at least some of the heat-radiating fins, and extends in the first axis positive direction from that end face. A second protective fin has an end face having an equal length in the juxtaposition direction to and mutually facing the end face on the first axis negative side of at least some of the heat-radiating fins, and extends in the first axis negative direction from that end face.

10 Claims, 14 Drawing Sheets

(51) Int. Cl.
*B61C 17/00* (2006.01)
*H01L 23/467* (2006.01)
*B61C 17/04* (2006.01)

(52) U.S. Cl.
CPC ....... *H01L 23/467* (2013.01); *H05K 7/20409* (2013.01); *H05K 7/20918* (2013.01); *H01L 2924/0002* (2013.01)

(58) Field of Classification Search
CPC .......... H01L 23/4006; H01L 23/49575; H05K 7/20918; H05K 7/20409; H05K 7/209; H05K 7/1432; H05K 7/2089; H05K 7/20909; B61C 17/04; B61C 17/00
See application file for complete search history.

(56) References Cited

U.S. PATENT DOCUMENTS

| | | | | |
|---|---|---|---|---|
| 2005/0057899 | A1* | 3/2005 | Lord | H01L 23/467 361/695 |
| 2008/0074845 | A1* | 3/2008 | Sun | H01L 23/467 361/712 |
| 2009/0145581 | A1* | 6/2009 | Hoffman | F28F 1/40 165/80.3 |
| 2010/0006261 | A1* | 1/2010 | Ishida | B61C 17/00 165/86 |
| 2012/0012294 | A1* | 1/2012 | Miki | B61C 17/00 165/185 |

FOREIGN PATENT DOCUMENTS

| | | |
|---|---|---|
| JP | 2003048533 A | 2/2003 |
| JP | 2003-258471 A | 9/2003 |
| JP | 2006-347309 A | 12/2006 |
| JP | 2007-134471 A | 5/2007 |
| JP | 2007-273777 A | 10/2007 |
| JP | 2009-96318 A | 5/2009 |
| JP | 2011-151924 A | 8/2011 |
| WO | WO 2010/109799 A1 | 9/2010 |

OTHER PUBLICATIONS

International Search Report (PCT/ISA/210) mailed on Jul. 2, 2013, by the Japanese Patent Office as the International Searching Authority for International Application No. PCT/JP2013/058853.

Written Opinion (PCT/ISA/237) mailed on Jul. 2, 2013, by the Japanese Patent Office as the International Searching Authority for International Application No. PCT/JP2013/058853.

* cited by examiner

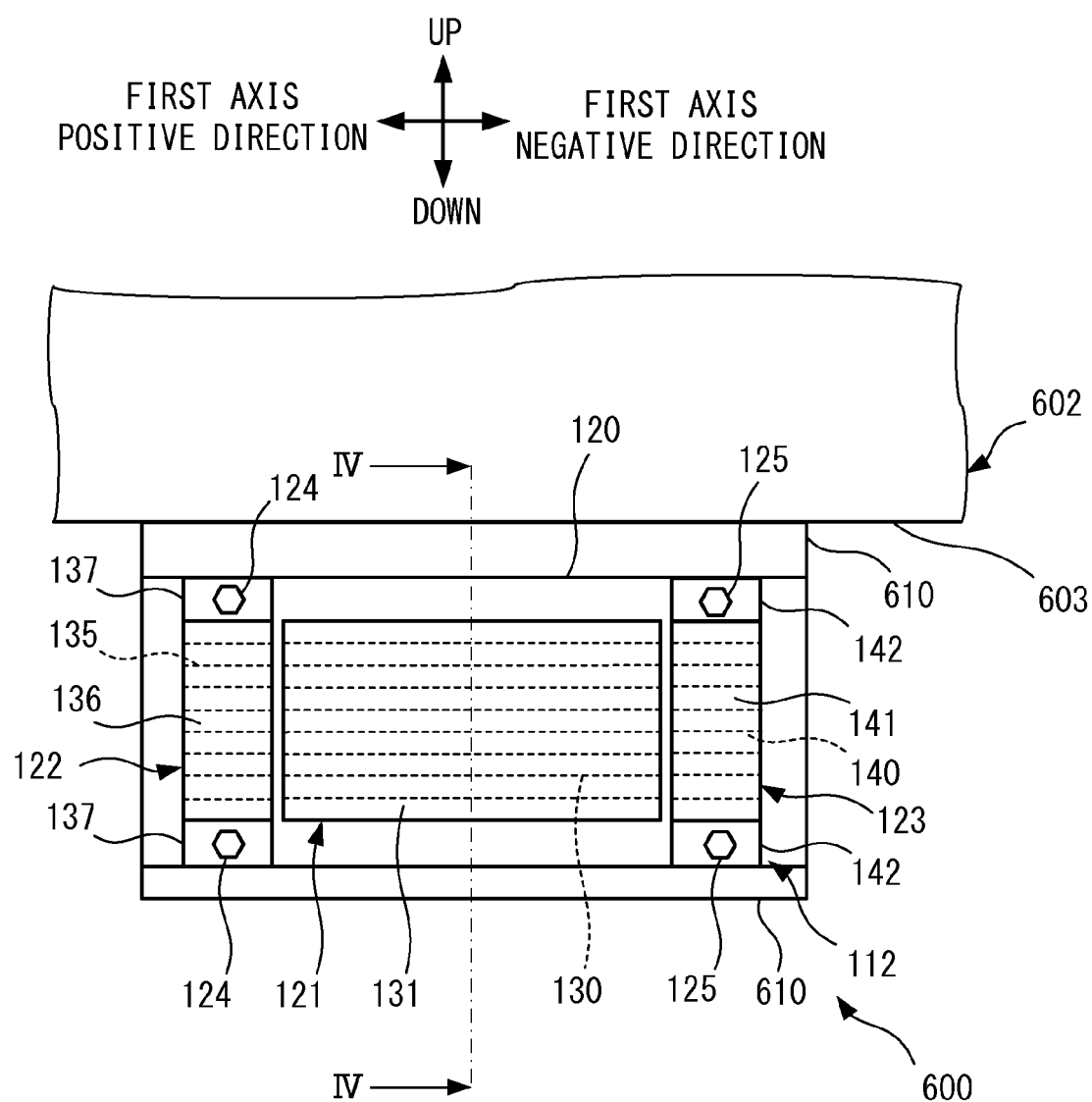

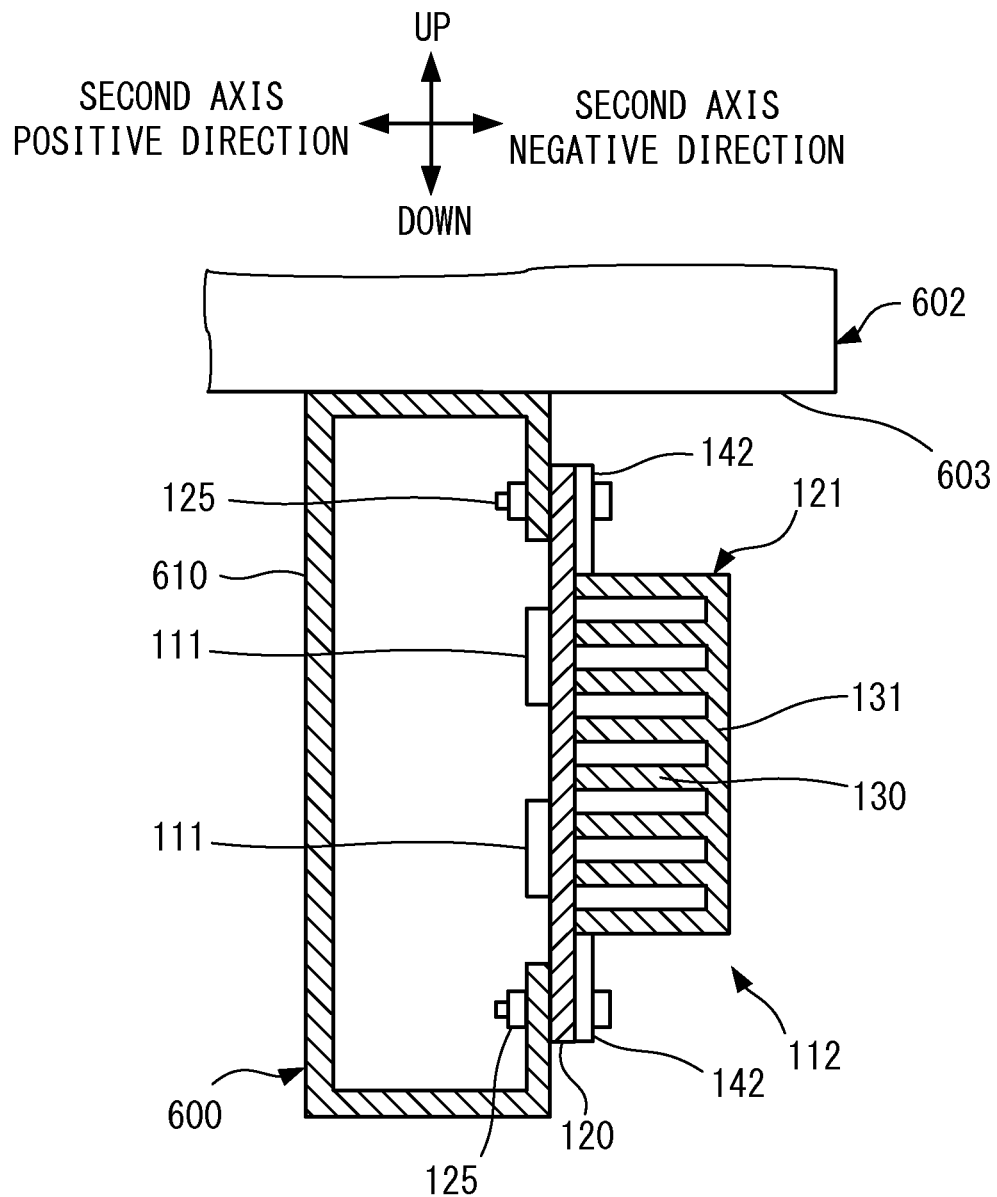

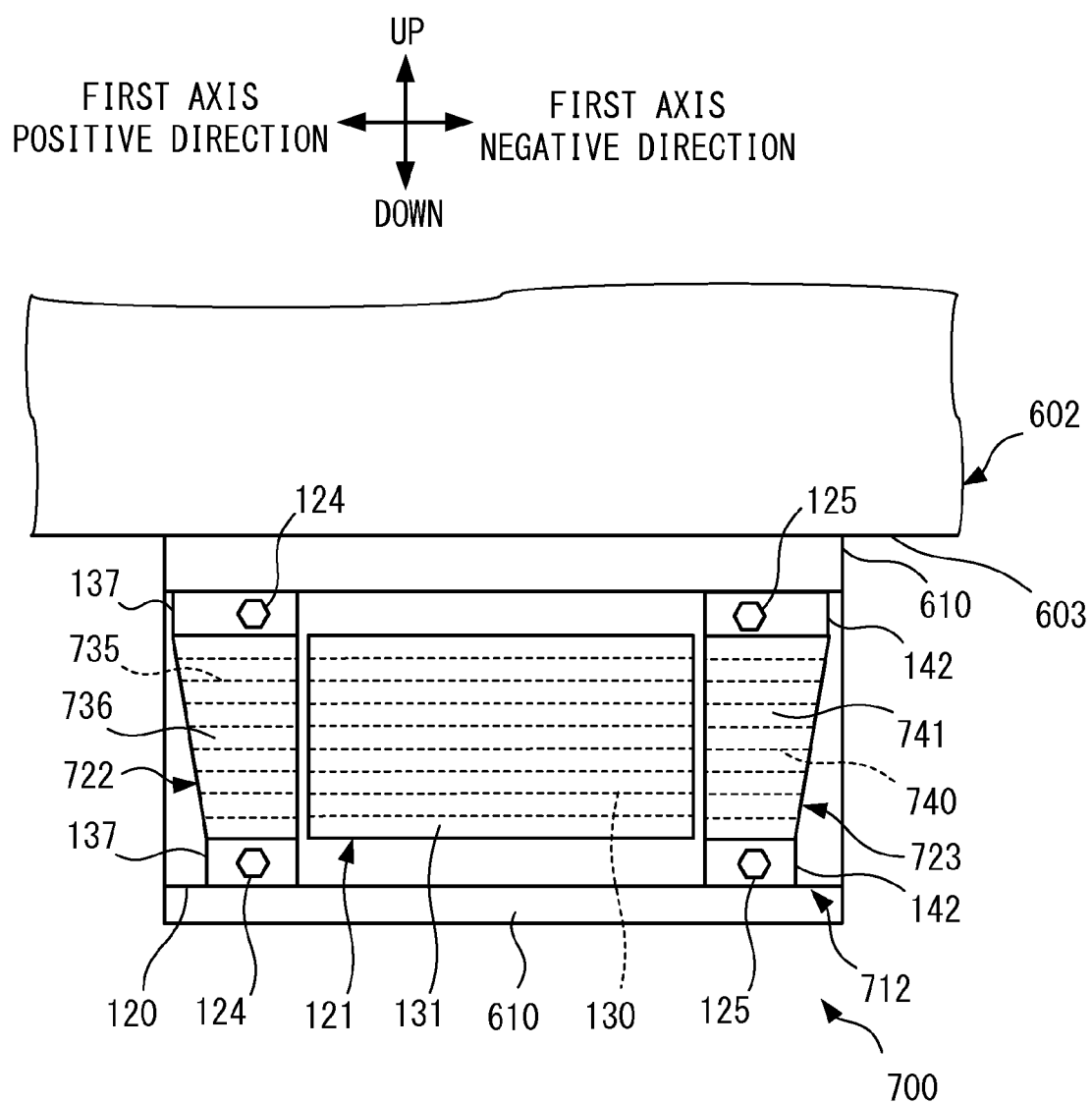

VEHICULAR POWER CONVERSION DEVICE

TECHNICAL FIELD

The present disclosure relates to a vehicular power conversion device.

BACKGROUND ART

The vehicular power conversion device mounted on railroad vehicles uses the power conversion semiconductor elements to convert the power supplied from the overhead line and outputs the converted power to the vehicle drive motor. The semiconductor elements generate heat during the power conversion. In order to prevent overheating of the semiconductor elements, the vehicular power conversion device generally has a cooler. Coolers utilizing the vehicle-induced turbulence for cooling the semiconductor elements have been proposed in the prior art (for example, see Patent Literature 1).

The cooler (cooling structure) of the vehicular power conversion device of the Patent Literature 1 has a radiator disposed between the vehicle floor board and vehicle bottom panel for cooling the vehicular power conversion device and air vents formed in the vehicle bottom panel in front of and behind the radiator. Heat-radiating fins are formed in the radiator and heat exchange occurs between the heat-radiating fins and the air as the air passes over the radiator.

CITATION LIST

Patent Literature

Patent Literature 1: Unexamined Japanese Patent Application Kokai Publication No. 2006-347309.

SUMMARY OF INVENTION

Technical Problem

The vehicular power conversion device described in the Patent Literature 1 has a problem that ballast (crushed stone and gravel) and the like flies and hits the heat-radiating fins through the air vents while the vehicle is running, causing the heat-radiating fins to be deformed or missing in part.

The present disclosure is made with the view of the above circumstance and an objective of the disclosure is to provide a vehicular power conversion device capable of protecting the heat-radiating fins from flying objects without significantly reducing the cooling performance.

Solution to Problem

In order to achieve the above objective, the vehicular power conversion device according to the present disclosure comprises:

semiconductor elements working for power conversion and generating heat;

a plurality of heat-radiating fins juxtaposed at intervals to form a passage in the axial direction, receiving the heat from the semiconductor elements, and expelling the heat into the air flowing through the passage;

a first protective fin including an end face having an equal length in the juxtaposition direction to and mutually facing one end face of at least some of the heat-radiating fins, and extending in one direction from that end face; and a second protective fin including an end face having an equal length in the juxtaposition direction to and mutually facing the other end face of at least some of the heat-radiating fins, and extending in the other direction from that end face.

Advantageous Effects of Invention

According to the present disclosure, a first protective fin and second protective fin are provided to one direction and the other direction of a plurality of heat-radiating fins, respectively, so as not to interfere with the inflow and outflow of the air into/from the passage formed by the heat-radiating fins. Therefore, it is possible to protect the heat-radiating fins from flying objects without significantly reducing the cooling performance.

BRIEF DESCRIPTION OF DRAWINGS

FIG. 12 is a side view of the vehicular power conversion device according to Embodiment 4;

FIG. 13 is a cross-sectional view of the vehicular power conversion device at the line IV-IV shown in FIG. 12; and FIG. 14 is a side view of the vehicular power conversion device according to Modified Embodiment 3.

DESCRIPTION OF EMBODIMENTS

Embodiments of the present disclosure is described hereafter with reference to the drawings. The same element is referred to by the same reference sign throughout the drawings. In the description of embodiments, a first axis direction and second axis direction are perpendicular to each other in a horizontal plane, one way in the first axis direction is referred to by the first axis positive direction, the other way in the first axis direction is referred to by the first axis negative direction, the way to the right when seen to the first axis positive direction is referred to by the second axis positive direction, the way to the left when seen to the first axis positive direction is referred to by the second axis negative direction, and the vertical direction is perpendicular to the first axis direction and second axis direction. These directions are defined for the purpose of explanation and are not intended to limit the present disclosure.

Embodiment 1

Figure 1:
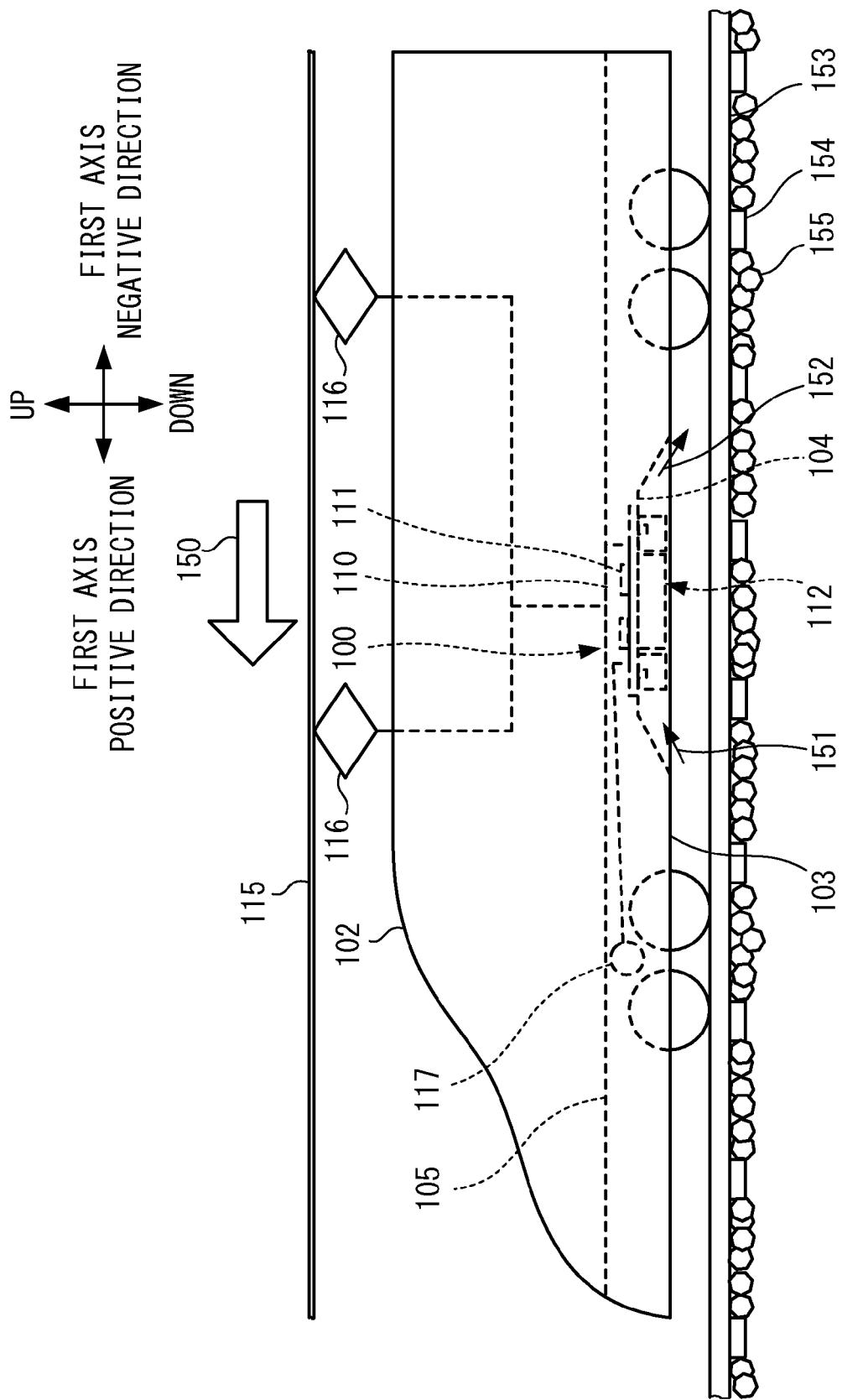
FIG. 1 is an illustration showing the vehicular power conversion device according to Embodiment 1 of the present disclosure mounted on a vehicle body by way of example.

A vehicular power conversion device 100 according to this embodiment is a device mounted on an electric railroad vehicle ("the vehicle," hereafter) such as the Shinkansen (Bullet Trains), and installed to a recess 104 formed in the lower part of the floor board 105 of a vehicle body 102 as shown in FIG. 1. The recess 104 forms a space (cove) hollowed upward from the bottom 103 of the vehicle body 102 in the lower part of the floor board 105 of the vehicle body 102.

The vehicular power conversion device 100 has, as shown in FIG. 1, an enclosure 110, semiconductor elements 111, and a cooler 112. When the vehicular power conversion device 100 is mounted on the vehicle body 102, as shown in FIG. 1, the enclosure 110 and semiconductor elements 111 are disposed above the recess 104. Furthermore, the cooler 112 is disposed below the recess 104 so as not to protrude below the bottom 103 of the vehicle body 102.

Figure 2:
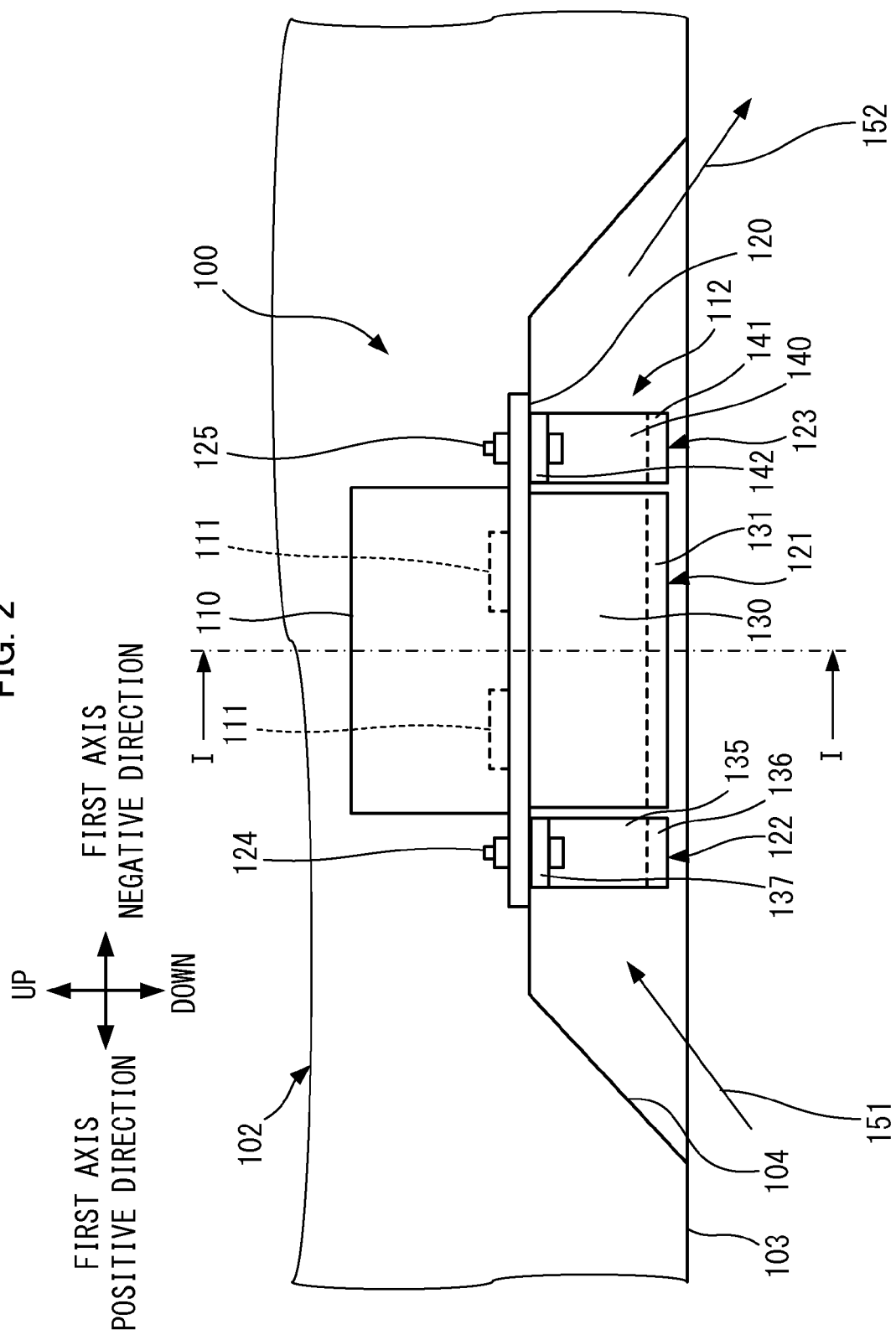
FIG. 2 is a side view of the vehicular power conversion device according to Embodiment 1.
Figure 3:
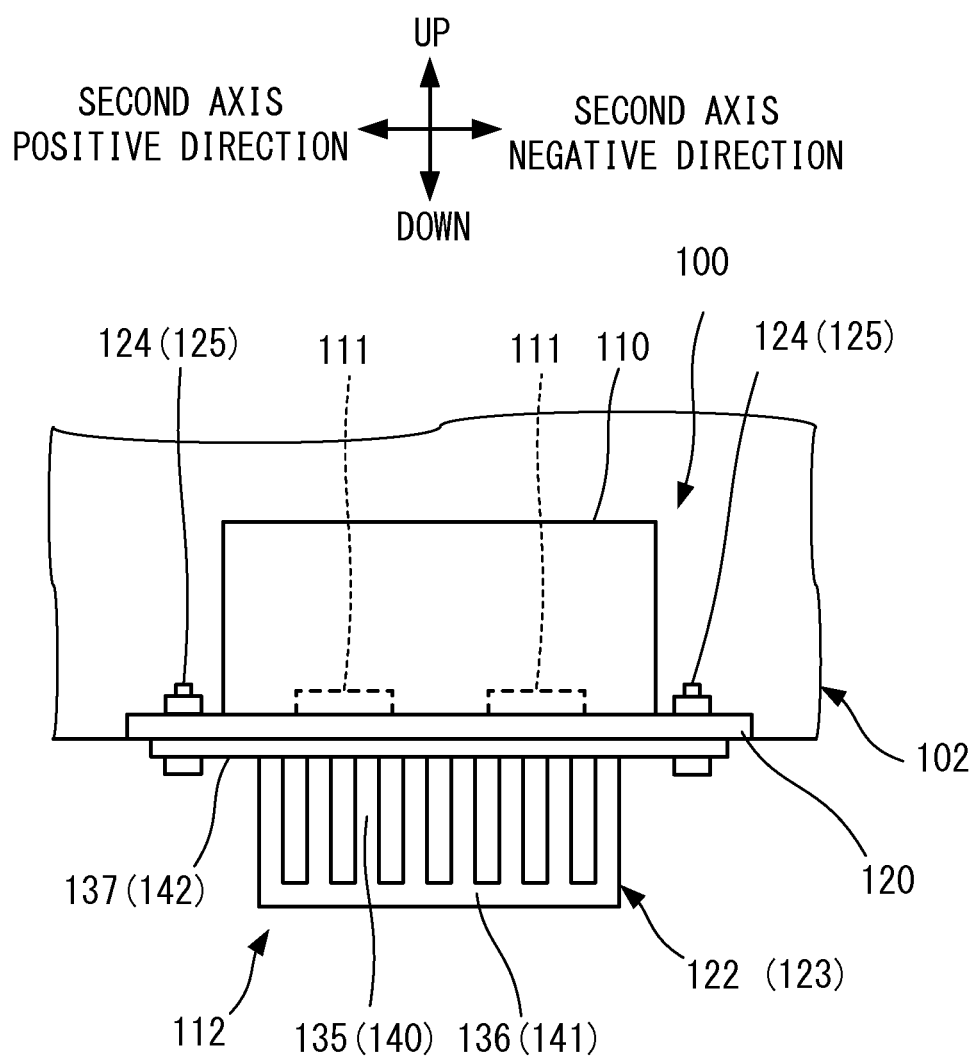
FIG. 3 is a front view of the vehicular power conversion device according to Embodiment 1.
Figure 4:
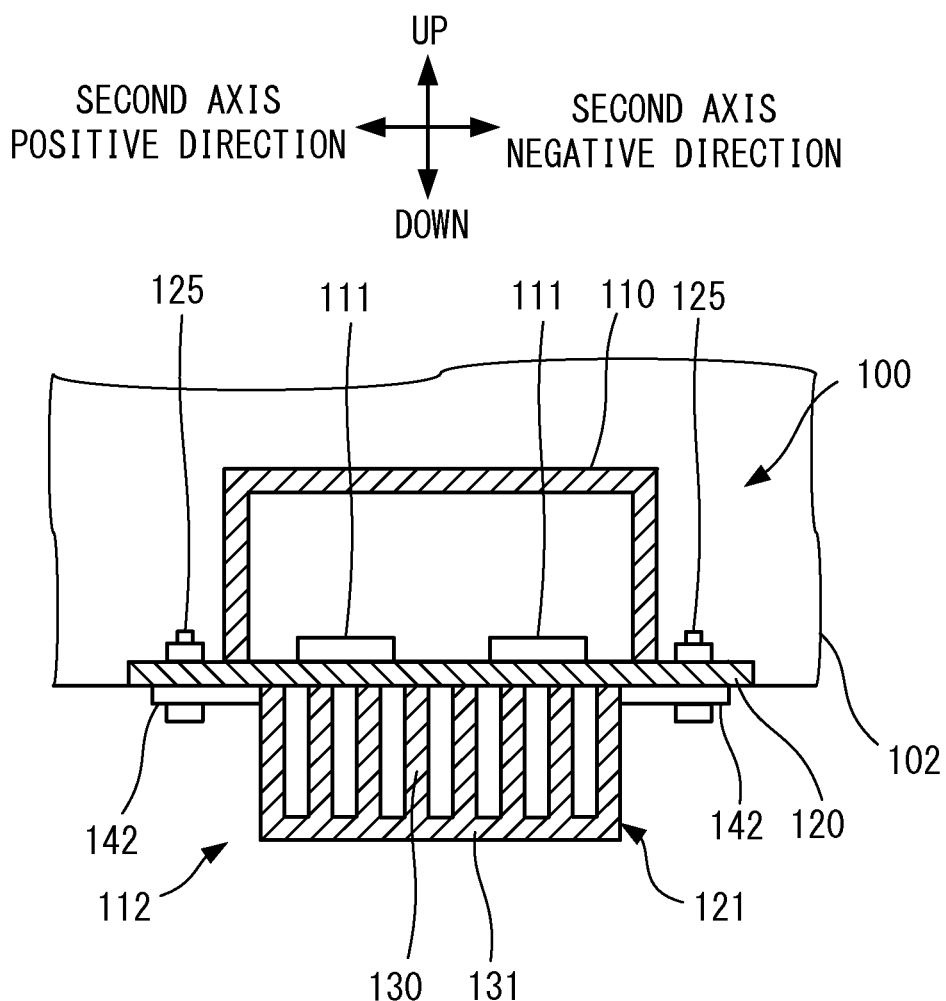
FIG. 4 is a cross-sectional view of the vehicular power conversion device at the line I-I shown in FIG. 2.

Here, FIG. 2 is a view of the vehicular power conversion device 100 when seen from a point in the second axis positive direction. FIG. 3 is a view of the vehicular power conversion device 100 when seen from a point in the first axis positive direction. FIG. 4 is a cross-sectional view of the vehicular power conversion device 100 at the line I-I shown in FIG. 2 when seen from a point in the first axis positive direction. The vehicle travels in the first axis positive direction or in the first axis negative direction. In the embodiment, it is assumed that the vehicle travels in the first axis positive direction as indicated by an arrow 150 in FIG. 1.

The enclosure 110 is a box-like member that is open at the bottom as shown, for example, in FIGS. 2 and 3. The enclosure 110 is attached to the cooler 112 at the lower end and houses the semiconductor elements 111 therein.

The semiconductor elements 111 are switching elements, diode elements, or the like working for converting the power supplied from an overhead line 115 via pantographs 116. The semiconductor elements 111 generate heat when they work. The semiconductor elements 111 output the converted power to a motor 117. The semiconductor elements 111 may convert AC power to DC power or convert DC power to AC power.

The semiconductor elements 111 can be made of a silicon material. Desirably, some or all of the semiconductor elements 111 are wide-gap semiconductor elements formed by a wide band gap semiconductor such as a silicon carbide, gallium nitride-based material, and diamond.

When the semiconductor elements 111 are formed by a wide gap semiconductor element, their high voltage resistance and high allowable ampacity make it possible to downsize the vehicular power conversion device 100. Their high heat-resistance makes it possible to downsize the cooler 112. Low power loss makes the semiconductor elements 111 highly efficient and leads to highly efficient power conversion.

The cooler 112 is a device for cooling the semiconductor elements 111 and has, as shown, for example, in FIG. 2, a base 120, a radiator 121, a first protector 122, a second protector 123, first fasteners 124, and second fasteners 125.

The base 120 is, as shown, for example, in FIG. 2, a flat plate-like member having a top surface and bottom surface facing each other.

The base 120 is made of a highly heat-conductive material, for example a metal material such as aluminum and copper. The semiconductor elements 111 are connected to the top surface of the base 120 so that the heat generated by the semiconductor elements 111 is transmitted to the base 120. The radiator 121 is attached to the bottom surface of the base 120.

The radiator 121 has, as shown, for example, in FIG. 4, multiple heat-radiating fins 130 and a detachment preventer 131.

The multiple heat-radiating fins 130 are fins for releasing the heat generated by the semiconductor elements 111 and have multiple fins extending in the first axis direction.

In detail, as shown in FIG. 4, the multiple heat-radiating fins 130 are juxtaposed in the second axis direction at given intervals on the bottom surface of the base 120 to receive the heat generated by the semiconductor elements 111 from the base 120. For example, the heat-radiating fins 130 each can be pressed in a groove formed in the bottom surface of the base 120, or provided integrally with the base 120 by extrusion molding, or welded or brazed to the bottom surface of the base 120.

The intervals of adjoining heat-radiating fins 130 in the second axis direction are all the same in this embodiment (for example, 1 cm) although the intervals can be determined as appropriate. As described above, the heat-radiating fins 130 extending in the first axis direction are juxtaposed in the second axis direction at intervals, whereby the multiple heat-radiating fins 130 form a passage extending in the first axis direction.

The heat-radiating fins 130 all have the same width in the second axis direction in this embodiment although their width can be determined as appropriate. The heat-radiating fins 130 are each made of a highly heat-conductive material, for example a metal material such as aluminum and copper.

The detachment preventer 131 is a member preventing the heat-radiating fins 130 from being detached. The detachment preventer 131 is, for example, a flat plate-like member connected to the lower ends of the multiple heat-radiating fins 130. The detachment preventer 131 is formed integrally with the multiple heat-radiating fins 130.

Moreover, the detachment preventer 131 can be a rod-like member extending between the ends of the multiple heat-radiating fins 130 in the second axis direction. Furthermore, the detachment preventer 131 can be a separate member from the multiple heat-radiating fins 130 and in such a case, attached to the lower ends of the heat-radiating fins 130.

Provision of the detachment preventer 131 prevents the heat-radiating fins 130 from falling off to the ground in the event that, for example, the connection between some of the heat-radiating fins 130 and the base 120 becomes loose or is disintegrated due to vibration while the vehicle runs.

The first protector 122 and second protector 123 are disposed near one end (on the first axis positive side) and the other end (on the first axis negative side) of the radiator 121, respectively, as shown in FIG. 2 to protect the ends of the heat-radiating fins 130. Moreover, the first protector 122 and second protector 123 can abut on the one end and the other end of the radiator 121, respectively.

The first protector 122 has, as shown, for example, in FIG. 3, multiple first protective fins 135, a first connector 136, and a first protective base 137. Similarly, the second protector 123 also has multiple second protective fins 140, a second connector 141, and a second protective base 142, which are indicated by reference signs in parentheses in FIG. 3.

The multiple first protective fins 135 and second protective fins 140 are multiple fins extending in the first axis direction on the first axis positive side and first axis negative side of the heat-radiating fins 130, respectively, in order to protect the ends of the heat-radiating fins 130. The fins are juxtaposed in the second axis direction.

In detail, the first protective fins 135 each have an end face having an equal width to and mutually facing one direction end face of one of all heat-radiating fins 130 on the other direction end (on the first axis negative side). Then, the first protective fins 135 each extend in the first axis positive direction from the other direction end face. It is sufficient that the other direction end face of each of the first protective fins 135 has a height equal to or greater than the height of the one direction end face of the facing heat-radiating fin 130.

The second protective fins 140 each have an end face having an equal width to and mutually facing the other direction end face of one of all heat-radiating fins 130 on the one direction end (on the first axis positive side). Then, the second protective fins 140 each extend in the first axis negative direction from the one direction end face. It is sufficient that the one direction end face of each of the second protective fins 140 has a height equal to or greater than the height of the other direction end face of the facing heat-radiating fin 130.

Here, the width is the length in the second axis direction, namely the direction in which the heat-radiating fins 130 are juxtaposed. The height is the length in the vertical direction, namely the direction from the base end to the tip of the heat-radiating fins 130.

In this embodiment, the heat-radiating fins 130 all have the same width and the intervals of adjoining heat-radiating fins 130 are all equal. Therefore, the first protective fins 135 and second protective fins 140 all have the same width. Furthermore, the intervals of adjoining first protective fins 135 and the intervals of adjoining second protective fins 140 are all equal.

Therefore, the first protective fins 135 and second protective fins 140 each extend almost continuously to the facing heat-radiating fin 130 in the first axis direction. As a result, the multiple first protective fins 135 and multiple second protective fins 140 form passages communicating in the first axis direction without interfering with the passage formed by the heat-radiating fins 130.

The first protective fins 135 and second protective fins 140 are sufficiently made of a material hard enough not to break even if flying objects such as ballast hit them, for example a metal material such as aluminum and copper or hard rubber and the like.

The first connector 136 and second connector 141 are each a flat plate-like member connecting the lower ends (tips) of the multiple first protective fins 135 or the lower ends (tips) of the multiple second protective fins 140. As a result, the multiple first protective fins 135 are integrated, whereby the first protective fins 135 are prevented from falling off to the ground, as the detachment preventer 131 prevents the heat-radiating fins 130 from falling off. Furthermore, the multiple second protective fins 140 are integrated, whereby the second protective fins 140 are prevented from falling off to the ground.

The first protective base 137 and second protective base 142 are each a member to which the upper ends of the first protective fins 135 or second protective fins 140 are attached. The top surfaces of the first protective base 137 and second protective base 142 each abut on and fixed to the bottom surface of the base 120. The first protective fins 135 and second protective fins 140 are attached to the bottom surfaces of the first protective base 137 and second protective base 142, respectively, by press fitting in grooves, integral molding, welding, brazing, or the like, as the heat-radiating fins 130 are attached to the base 120.

The first protective base 137 and second protective base 142 each have holes in the parts extending from the first protective fins 135 or second protective fins 140 in the second axis positive direction and second axis negative direction, respectively. The holes communicate with through-holes penetrating the base 120 and recess 104.

The first fasteners 124 and second fasteners 125 are members fastening the base 120 to the recess 104. As shown, for example, in FIG. 2, the first fasteners 124 and second fasteners 125 fasten to the recess 104 the parts of the base 120 that are on the first axis positive side and first axis negative side of the part where the radiator 121 is attached, respectively. For example, the first fasteners 124 and second fasteners 125 each have a bolt inserted in the through-hole penetrating the base 120, recess 104, and first protective base 137 or second protective base 142, and a nut screwed on the bolt.

The configuration of the vehicular power conversion device 100 according to this embodiment is described above. The behavior of the vehicular power conversion device 100 is described hereafter.

In this embodiment, the base 120 is attached to the recess 104 of the vehicle body 102 almost horizontally so that the top surface of the base 120 serves as the semiconductor connection surface to which the semiconductor elements 111 are connected and the bottom surface thereof serves as the fin connection surface to which the heat-radiating fins are connected. As a result, the radiator 121, first protector 122, and second protector 123 are disposed in a cove formed below the recess 104 as shown in FIG. 1 and exposed to the outside air. The cove formed by the recess 104 includes spaces to introduce the air into the radiator 121 and discharge the air from the radiator 121 on the first axis positive side of the first protector 122 and on the first axis negative side of the second protector 123.

Therefore, when the vehicle runs, part of the vehicle-induced turbulence passes through the passage formed by the first protective fins 135, the passage formed by the heat-radiating fins 130, and the passage formed by the second protective fins 140 in sequence. For example, when the vehicle runs in the direction indicated by the arrow 150 in the same figure (in the first axis positive direction), the vehicle-induced turbulence in the first axis negative direction occurs. As a result, as indicated by an arrow 151, the air flows into the passage within the radiator 121 via the passage within the first protector 122. After passing through the radiator 121, the air exits outside through the passage within the second protector 123 as indicated by an arrow 152.

While the vehicle is running, the semiconductor elements 111 convert the power and generate heat. The heat generated by the semiconductor elements 111 is transmitted to the top surface of the base 120. Since the base 120 is made of a highly heat-conductive material, the heat from the semiconductor elements 111 is transmitted through the base 120 downward and reaches the heat-radiating fins 130 via the bottom surface. Since the heat-radiating fins 130 are each made of a highly heat-conductive material, the heat-radiating fins 130 transmit the heat generated by the semiconductor elements 111 and received from the base therein and expel the heat into the air flowing through the passage. As a result, the semiconductor elements 111 are cooled.

Part of the vehicle-induced turbulence passes through the passage within the first protector 122 and then flows into the passage within the radiator 121 as described above. The first protective fins 135 each extend in the first axis positive direction from their other end face having an equal width to and mutually facing the one end face of the heat-radiating fins 130. Therefore, the first protective fins 135 do not block the passage within the radiator 121 or interface with the inflow of the air into the passage within the radiator 121.

Here, in order for the air to smoothly flow into the passage within the radiator 121 from the passage within the first protector 122, the first protector 122 is desirably disposed near the radiator 121 and can even abut on the radiator 121.

The air having passed through the passage within the radiator 121 passes through the passage within the second protector 123 before being discharged outside as described above. The second protective fins 140 each extend in the first axis negative direction from their one end face having an equal width to and mutually facing the other end face of the heat-radiating fins 130. Therefore, the second protective fins 140 do not block the passage within the radiator 121 or interfere with the outflow of the air from the passage within the radiator 121.

Here, in order for the air to smoothly flow into the passage within the second protector 123 from the passage within the radiator 121, the second protector 123 is desirably disposed near the radiator 121 and can even abut on the radiator 121.

As described above, according to this embodiment, the first protector 122 and second protector 123 do not interfere with the inflow of the air into the radiator 121 and the outflow of the air from the radiator 121. Therefore, even with provision of the first protector 122 and second protector 123, the air is allowed to pass through the radiator 121 nearly as in the case of the first protector 122 and second protector 123 being not provided. Therefore, provision of the first protector 122 and second protector 123 does not significantly reduce the cooling performance of the cooler 112.

When the first protective fins 135 are made of a highly heat-conductive material, for example a metal material such as aluminum and copper, the first protective fins 135 can transmit the heat generated by the semiconductor elements 111 and received from the base 120 therein and expel the heat into the air flowing through the passage. Therefore, with the first protective fins 135 being made of a highly heat-conductive material, the cooling performance of the cooler 112 can be improved compared with the cooler provided with the heat-radiating fins 130 only. As for the second protective fins 140, similarly, with the second protective fins 140 being made of a highly heat-conductive material, the cooling performance of the cooler 112 can be improved compared with the cooler provided with the heat-radiating fins 130 only.

Since the cooler 112 is exposed to the outside air as mentioned above, ballast 155 and the like laid around the rails 153 and crossties 154 may fly and hit the cooler 112 while the vehicle is running.

According to this embodiment, the ballast and the like flying from somewhere in the first axis positive direction or in the first axis negative direction hit the first protective fins 135 or the second protective fins 140. Therefore, the first protective fins 135 and second protective fins 140 facing all of the heat-radiating fins 130 can prevent the flying objects from hitting the ends of all heat-radiating fins 130 in the first axis direction for sure.

The multiple first protective fins 135 are, as described above, connected by the first connector 136 and attached in one piece to the recess 104 of the vehicle body 102. Therefore, even if any of the first protective fins 135 is hit and damaged by a flying object, the multiple first protective fins 135 can be replaced by unfastening the first fasteners 124. The multiple second protective fins 140 can similarly be replaced by unfastening the second fasteners 125. In other words, there is no need of complex task such as detaching the entire vehicular power conversion device 100 from the vehicle body 102. Therefore, maintenance work when hit and damaged by a flying object becomes easy.

Furthermore, the first fasteners 124 can be a member provided to a conventional vehicular power conversion device for fastening the base 120 to the vehicle body 102. In other words, there is no need of specially processing a conventional vehicular power conversion device or adding a special member for attaching the first protective fins 135 to the vehicle body 102. Therefore, the vehicular power conversion device 100 can easily be manufactured.

Embodiment 1 of the present disclosure is described above. The present disclosure is not confined to the above and can be modified as follows.

For example, the first protective fins 135 can be disposed to face only some of the heat-radiating fins 130. Also with this, the heat-radiating fins 130 faced with the first protective fins 135 can be protected without significantly reducing the cooling performance of the cooler 112. Similarly, the second protective fins 140 can be disposed to face only some of the heat-radiating fins 130. Also with this, the heat-radiating fins 130 faced with the second protective fins 140 can be protected.

In a case of the first protective fins 135 being disposed to face only some of the heat-radiating fins 130, the first protective fins 135 are disposed to face only every other heat-radiating fin 130. It is assumed that crushed stone of the minimum length of approximately 5 cm is used as the ballast and the width of all heat-radiating fins and the intervals of adjoining ones are approximately 1 cm. In such a case, even if the first protective fins 135 are disposed to face only every other heat-radiating fin 130, the intervals of adjoining first protective fins 135 are 3 cm, which is smaller than the ballast size. Therefore, even if the first protective fins 135 are disposed to face only some of the heat-radiating fins 130, not only the heat-radiating fins 130 faced with the first protective fins 135 but all heat-radiating fins 130 can be protected at the one end from flying ballast.

Modified Embodiment 1

In Embodiment 1, the one end face of each of the first protective fins 135 is positioned on a plane perpendicular to the first axis direction. However, the plane on which the one end face of each of the first protective fins is positioned is not limited to a plane perpendicular to the first axis direction.

Figure 5:
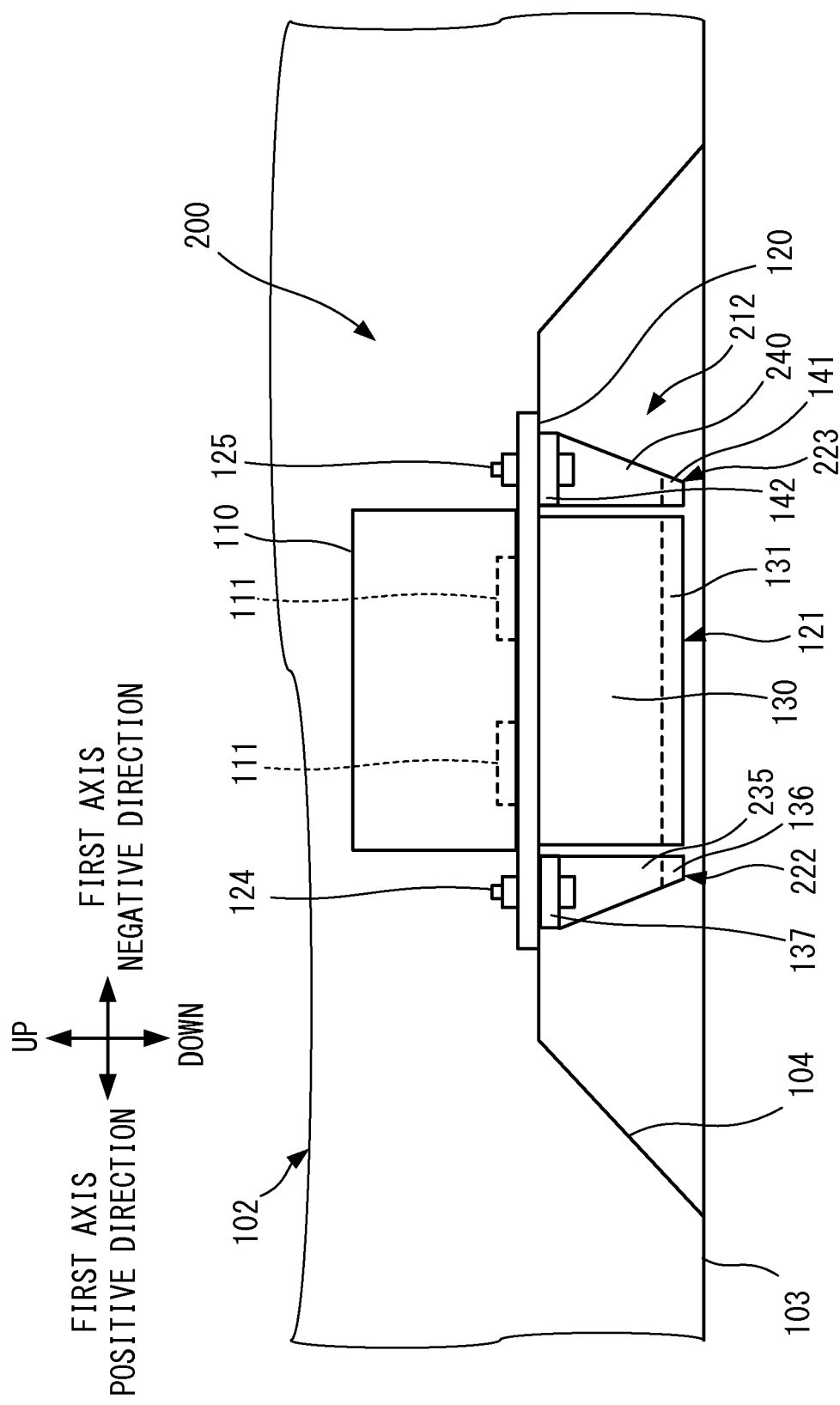
FIG. 5 is a side view of the vehicular power conversion device according to Modified Embodiment 1.

A vehicular power conversion device 200 according to this Modified Embodiment has, as shown in FIG. 5, generally the same configuration as the vehicular power conversion device 100 according to Embodiment 1. In the vehicular power conversion device 200 according to this Modified Embodiment, a first protector 222 and second protector 223 of a cooler 212 have first protective fins 235 and second protective fins 240, respectively, in place of the first protective fins 135 and second protective fins 140 according to Embodiment 1.

When the vehicular power conversion device 200 is mounted on the vehicle body 102, the first protective fins 235 and second protective fins 240 are disposed with their tips facing down like the first protective fins 135 and second protective fins 140 according to Embodiment 1.

The one end face of each of the first protective fins 235 is, as shown in the same figure, positioned on a plane gradually protruding in the first axis positive direction as it goes up. Furthermore, as shown in the same figure, the other end face of each of the second protective fins 240 is positioned on a plane gradually protruding in the first axis negative direction as it goes up.

When a flying object hits the first protective fins 235, the flying object tends to fly from somewhere obliquely below and hit the one end faces thereof. Similarly, when a flying object hits the second protective fins 240, the flying object tends to fly from somewhere obliquely below and hit the one other end faces thereof.

With the one end faces of the first protective fins 235 and the other end faces of the second protective fins 240 being positioned on the planes tilted downward as in this Modified Embodiment, the area in which a flying object hits the first protective fins 235 or second protective fins 240 can be enlarged compared with when positioned on a plane perpendicular to the first axis direction. As a result, the force received upon hit is spread. Therefore, damage to the first protective fins 235 and second protective fins 240 due to the flying objects such as deformation and missing can be reduced.

Modified Embodiment 2

In this Modified Embodiment, as in Modified Embodiment 1, the one end face of each of the first protective fins and the other end face of each of the second protective fins are positioned in other planes.

Figure 6:
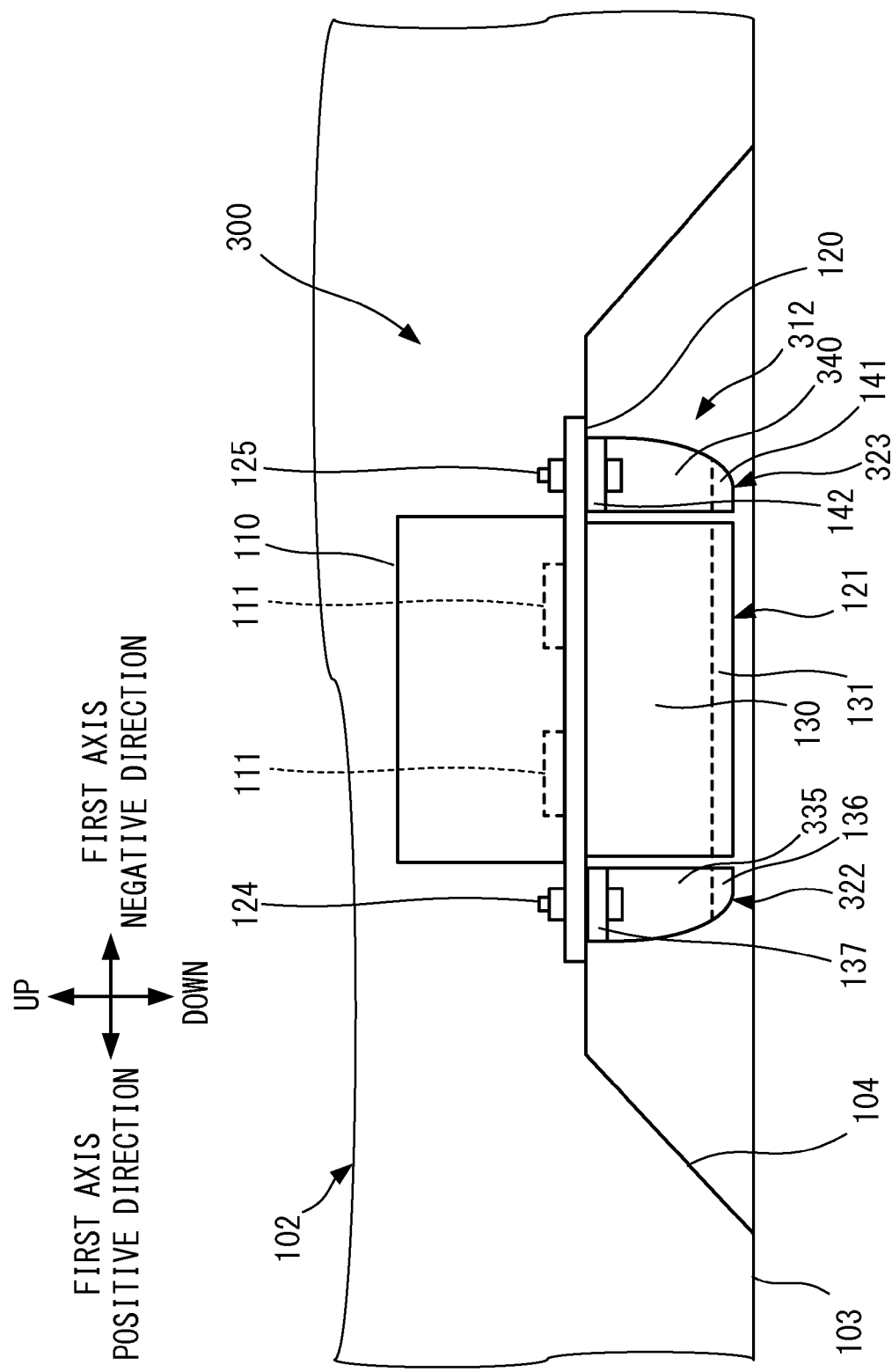
FIG. 6 is a side view of the vehicular power conversion device according to Modified Embodiment 2.

A vehicular power conversion device 300 according to this Modified Embodiment has, as shown in FIG. 6, generally the same configuration as the vehicular power conversion device 100 according to Embodiment 1. In the vehicular power conversion device 300 according to this Modified Embodiment, a first protector 322 and second protector 323 of a cooler 312 have first protective fins 335 and second protective fins 340, respectively, in place of the first protective fins 135 and second protective fins 140 according to Embodiment 1.

When the vehicular power conversion device 300 is mounted on the vehicle body 102, the first protective fins 335 and second protective fins 340 are disposed with their tips facing down like the first protective fins 135 and second protective fins 140 according to Embodiment 1.

The one end face of each of the first protective fins 335 is, as shown in the same figure, positioned on a curved plane gradually protruding in the first axis positive direction as it goes up. This curved plane is convex protruding in the first axis positive direction and downward (toward the bottom left in the same figure).

Furthermore, as shown in the same figure, the other end face of each of the second protective fins 340 according to this Modified Embodiment is positioned on a curved plane gradually protruding in the first axis negative direction as it goes up. This curved plane is convex protruding in the first axis negative direction and downward (toward the bottom right in the same figure).

Also in this Modified Embodiment, as in Modified Embodiment 1, the one end faces of the first protective fins 335 and the other end faces of the second protective fins 340 are positioned on the planes tilted downward. Therefore, the area in which a flying object hits the one end faces of the first protective fins 335 or the other end faces of the second protective fins 340 can be enlarged compared with when positioned on a plane perpendicular to the first axis direction. As a result, the force received upon hit is spread. Therefore, damage to the first protective fins 335 and second protective fins 340 due to the flying objects such as deformation and missing can be reduced.

Embodiment 2

Figure 7:
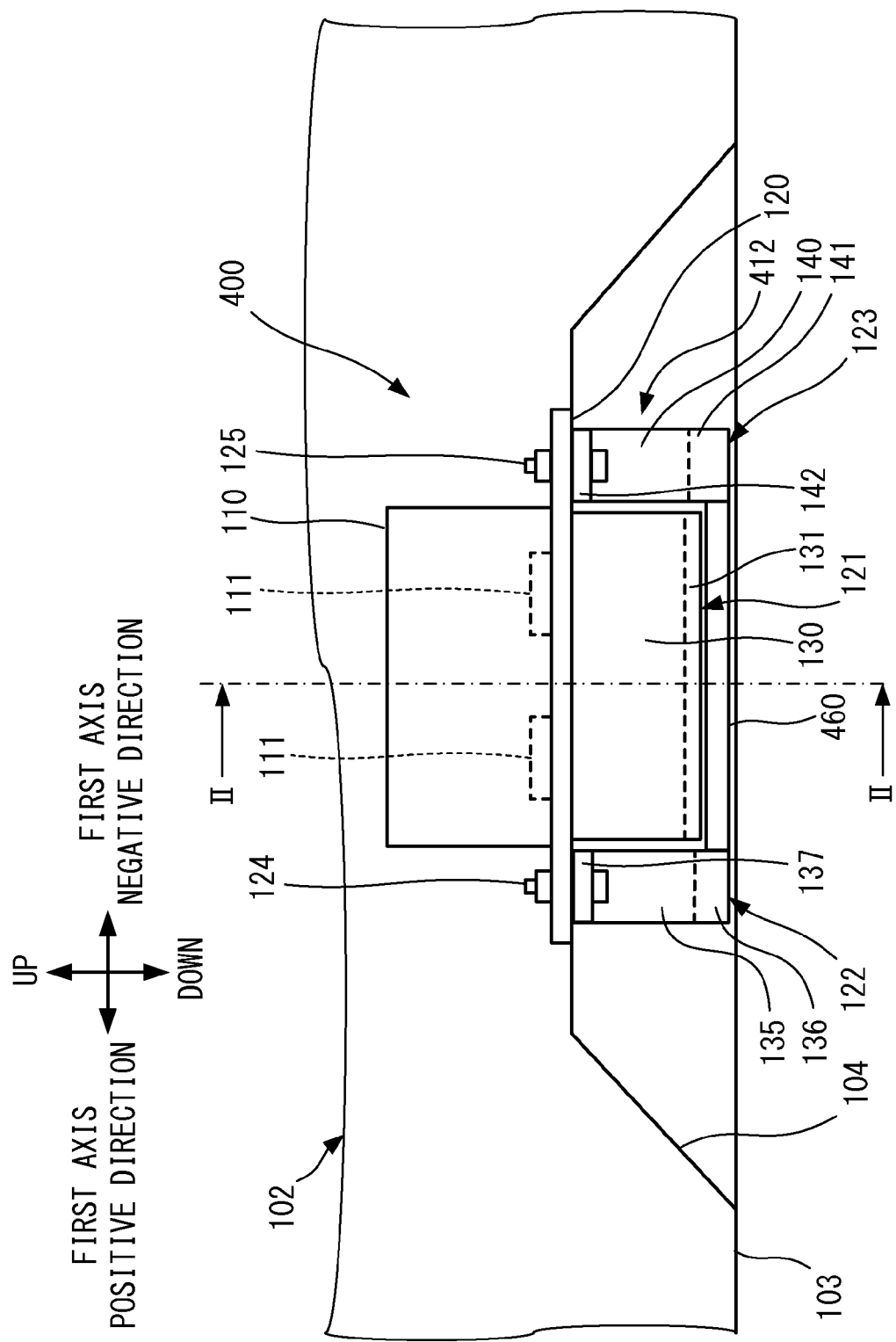
FIG. 7 is a side view of the vehicular power conversion device according to Embodiment 2 of the present disclosure.
Figure 8:
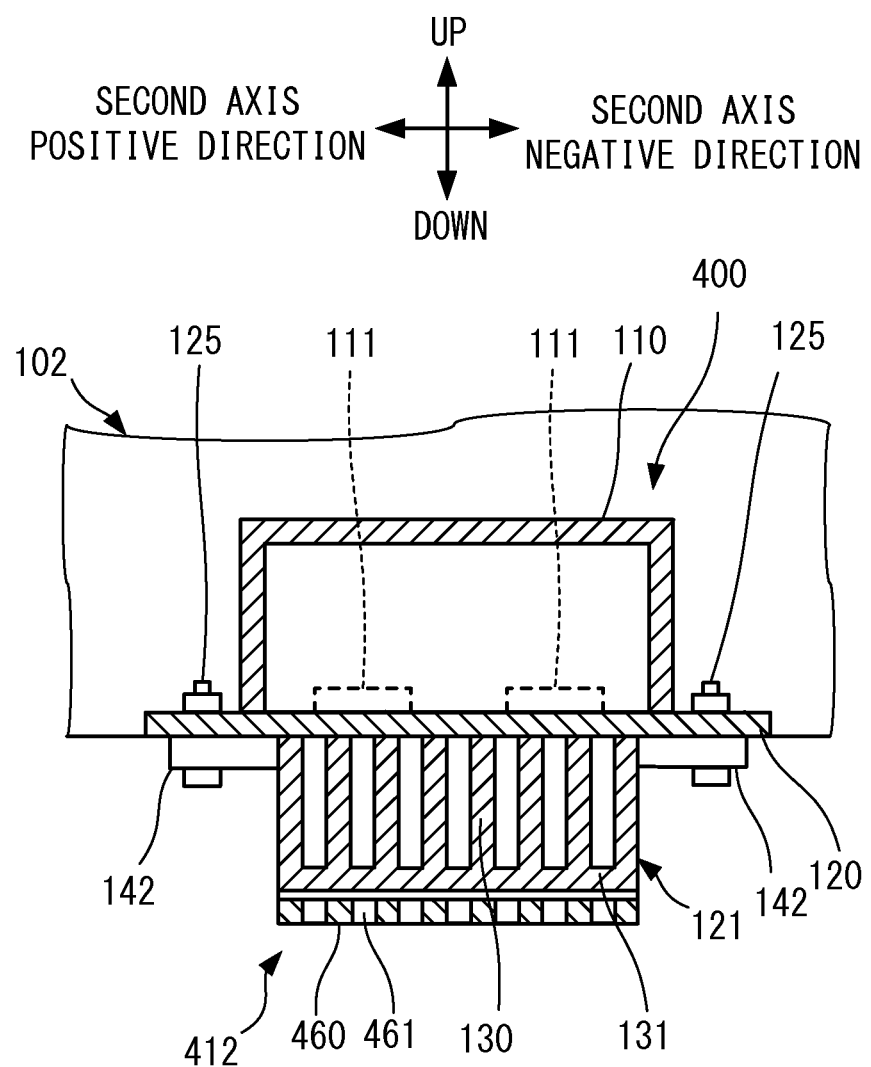
FIG. 8 is a cross-sectional view of the vehicular power conversion device at the line II-II shown in FIG. 7.

In a vehicular power conversion device 400 according to this embodiment, as shown in FIGS. 7 and 8, a cooler 412 has a tip end protector 460 in addition to the configuration of the vehicular power conversion device 100 according to Embodiment 1.

Here, FIG. 7 is a view of the vehicular power conversion device 400 when seen from a point in the second axis positive direction. FIG. 8 is a cross-sectional view of the vehicular power conversion device 400 at the line II-II shown in FIG. 7 when seen from a point in the first axis positive direction.

The tip end protector 460 is a flat plate-like member horizontally disposed outside the multiple heat-radiating fins on the tip side, namely below the radiator 121. Preferably, the tip end protector 460 is made of the same material as the first protective fins 135. The tip end protector 460 can, for example, be connected and fixed to the first connector 136 and second connector 141 by not-shown attachment members, or formed integrally with the first connector 136 and second connector 141. The tip end protector 460 has slits 461 extending in the first axis direction as shown in FIG. 8.

According to this embodiment, the tip end protector 460 can protect the lower part of the radiator 121 from the flying objects. Particularly, when the tips of the heat-radiating fins 130 are exposed outside because the detachment preventer 131 is rod-shaped or for some other reason, the tips of the heat-radiating fins 130, which are generally vulnerable, can be protected from the flying objects.

Furthermore, the tip end protector 460 has the slits 461, whereby the air around the radiator 121 can flow nearly as in the case of the tip end protector 460 being not provided. As a result, reduction in the cooling performance of the cooler 412 can be suppressed.

Embodiment 3

Figure 9:
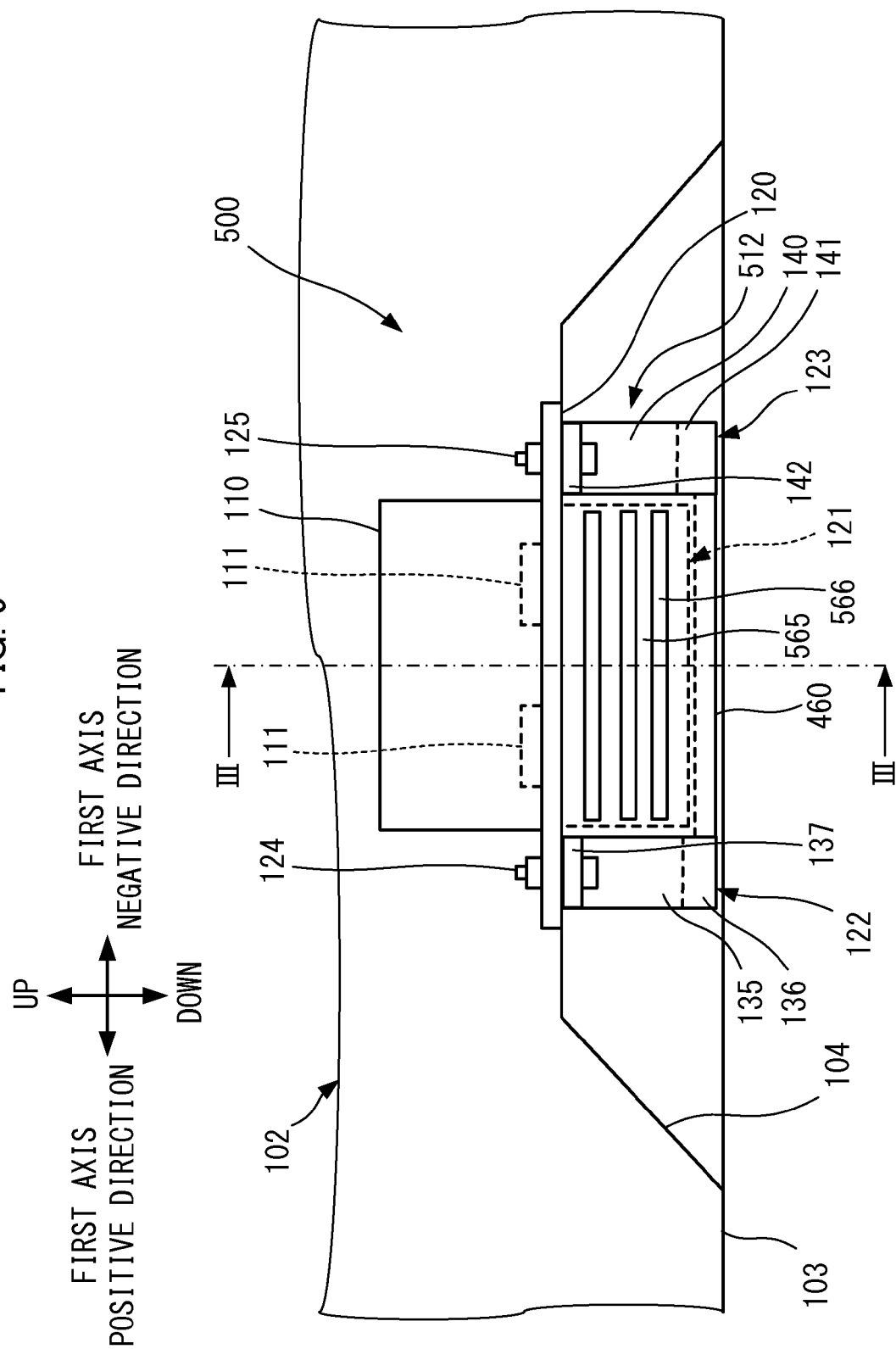
FIG. 9 is a side view of the vehicular power conversion device according to Embodiment 3 of the present disclosure.
Figure 10:
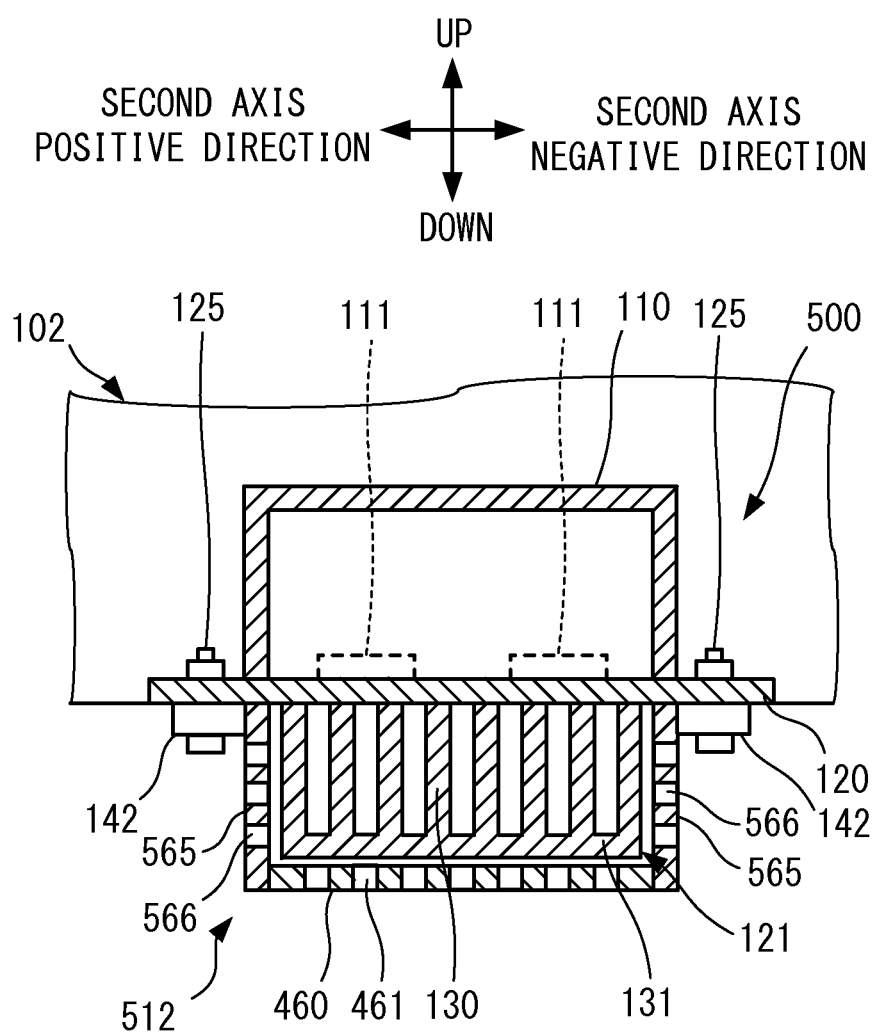
FIG. 10 is a cross-sectional view of the vehicular power conversion device at the line III-III shown in FIG. 9.

In a vehicular power conversion device 500 according to this embodiment, as shown in FIGS. 9 and 10, a cooler 512 has two end fin protectors 565 in addition to the configuration of the vehicular power conversion device 400 according to Embodiment 2.

Here, FIG. 9 is a view of the vehicular power conversion device 500 when seen from a point in the second axis positive direction. FIG. 10 is a cross-sectional view of the vehicular power conversion device 500 at the line III-III shown in FIG. 9 when seen from a point in the first axis positive direction.

The end fin protectors 565 are flat plate-like members disposed along the vertical direction and first axis direction on the second axis positive side of the heat-radiating fin 130 provided at the end in the second axis positive direction and on the second axis negative side of the heat-radiating fin 130 provided at the end in the second axis negative direction, respectively. Preferably, the end fin protectors 565 are each made of the same material as the first protective fins 135.

The end fin protectors 565 each can, for example, be connected and fixed to the ends of the first protector 122 and second protector 123 by not-shown attachment members, or formed integrally with the first protector 122 and second protector 123.

The end fin protectors 565 each have slits 566 extending in the first axis direction as shown in FIG. 9.

According to this embodiment, both sides of the radiator 121 can be protected from the flying objects by the end fin protectors 565.

Furthermore, the end fin protectors 565 have the slits 566, whereby the air around the radiator 121 can flow nearly as in the case of the end fin protectors 565 being not provided.

As a result, reduction in the cooling performance of the cooler 512 can be suppressed.

Moreover, the end fin protector 565 can be provided only in either one of the second axis positive direction and second axis negative direction. Even with this, the side of the radiator 121 where the end fin protector 565 is provided can be protected from the flying objects.

Embodiment 4

Figure 11:
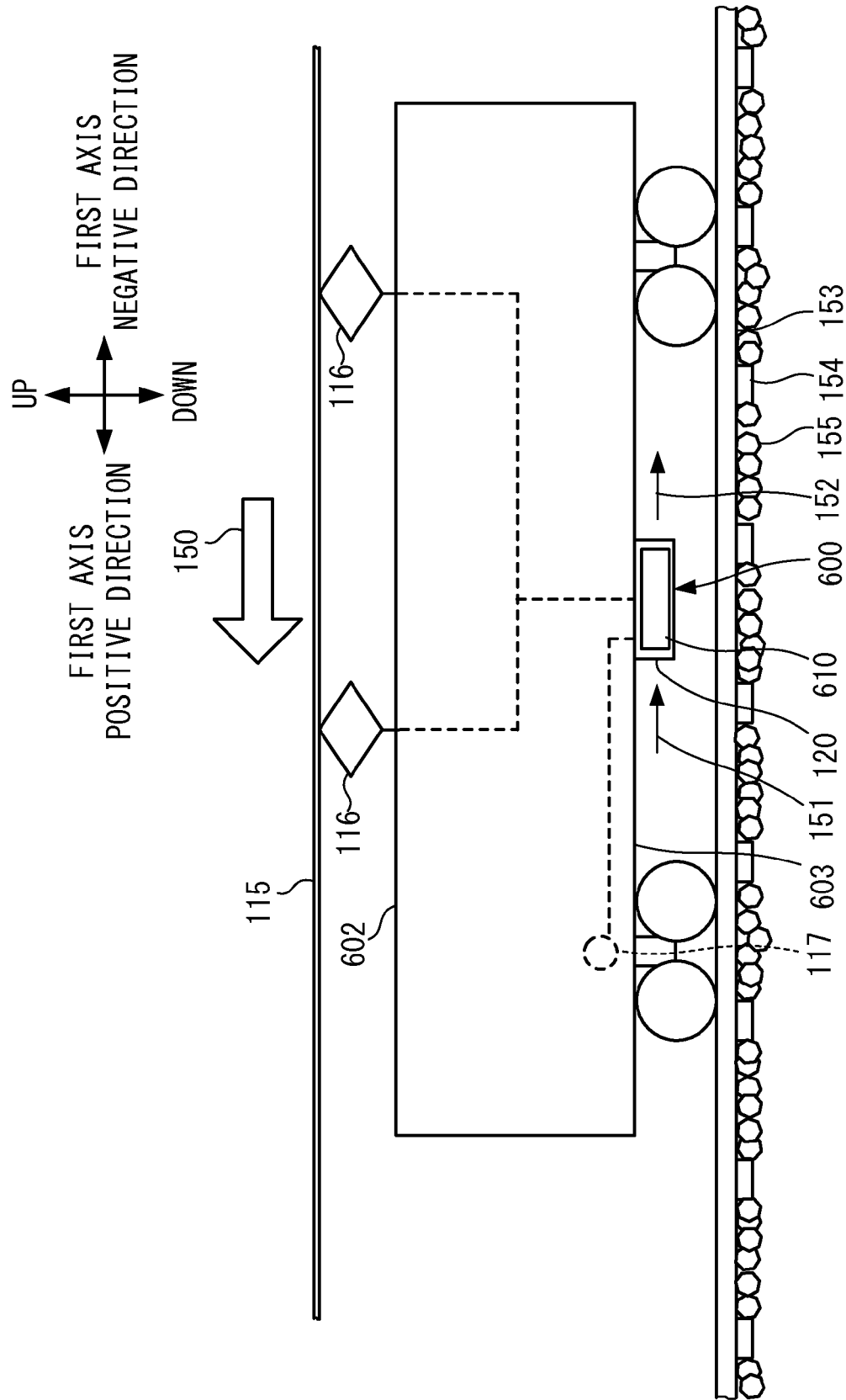
FIG. 11 is an illustration showing the vehicular power conversion device according to Embodiment 4 of the present disclosure mounted on a vehicle body by way of example.

In Embodiment 1, the case where the vehicular power conversion device 100 is mounted on the vehicle body 102 and the base 120 is disposed along the first axis direction and second axis direction is described. Consequently, the heat-radiating fins 130 are disposed along the first axis direction and vertical direction. In this embodiment, as shown in FIG. 11, when a vehicular power conversion device 600 is mounted on a vehicle body 602, the base 120 is disposed along the first axis direction and vertical direction. Therefore, the heat-radiating fins 130 are disposed along the first axis direction and second axis direction.

The vehicular power conversion device 600 has, as shown in FIGS. 12 and 13, generally the same configuration as the vehicular power conversion device 100 according to Embodiment 1 and has an enclosure 610 in place of the enclosure 110 according to Embodiment 1.

Here, FIG. 11 is an illustration showing the vehicular power conversion device 600 mounted on the vehicle body 602 by way of example. FIG. 12 is a view of the vehicular power conversion device 600 when seen from a point in the second axis positive direction. FIG. 13 is a cross-sectional view of the vehicular power conversion device 600 at the line IV-IV shown in FIG. 12 when seen from a point in the first axis positive direction.

As shown, for example, in FIG. 13, the enclosure 610 is longer than the base 120 in the vertical direction and protrudes above the base 120. As a result, the top surface of the enclosure 610 abuts on and is attached to the bottom 603 of the vehicle body 602. Moreover, it is preferable that the enclosure 610 has the same length in the first axis direction as the base 120.

According to this embodiment, the heat-radiating fins 130, first protective fins 135, and second protective fins 140 are all disposed along the first axis direction and second axis direction. Furthermore, the first protector 122 and second protector 123 form passages communicating in the first axis direction without interfering with the passage within the radiator 121. Therefore, as in Embodiment 1, even though the first protector 122 and second protector 123 are provided, the cooling performance of the cooler 112 is not significantly reduced. Furthermore, the first protective fins 135 and second protective fins 140 can prevent the flying objects from hitting the ends in the first axis direction of the heat-radiating fins 130.

Embodiment 4 of the present disclosure is described above. The present disclosure is not confined to the above and can be modified as follows.

For example, also in this embodiment, as in Embodiment 2, the tip end protector can be provided outside the multiple heat-radiating fins 130 on the tip side, namely on the side of the radiator 121 (on the right in FIG. 13). As a result, the side of the radiator 121 can be protected from the flying objects.

For example, also in this embodiment, as in Embodiment 3, the end fin protector can be disposed below the lowermost heat-radiating fin 130 when the vehicular power conversion device 600 is mounted on the vehicle body 602. As a result, the lower part of the radiator 121 can be protected from the flying objects.

Modified Embodiment 3

Also in this embodiment, as described in Modified Embodiments 1 and 2, the one end face of each of the first protective fins can be positioned on a plane or curbed plane gradually protruding in first axis positive direction as it goes up. The other end face of each of the second protective fins can be positioned on a plane or curbed plane gradually protruding in first axis negative direction as it goes up.

FIG. 14 is a side view of a vehicular power conversion device 700 according to this Modified Embodiment when seen from a point in the second axis negative direction.

In the vehicular power conversion device 700, a cooler 712 has, as shown in the same figure, a first protector 722 and a second protector 723 in place of the first protector 122 and second protector 123 in Embodiment 4.

The first protector 722 has first protective fins 735 and a first connector 736 in place of the first protective fins 135 and first connector 136 in Embodiment 4.

The first protective fins 735 have the length in the first axis direction increased as their position goes up and their one end faces form a plane gradually protruding in the first axis positive direction at the same inclination as it goes up. As a result, the one end faces of the first protective fins 735 are positioned on a plane. It is preferable that the one end face of the first connector 736 is also positioned on the same plane as the one end faces of the first protective fins 735.

The second protector 723 has second protective fins 740 and a second connector 741 in place of the second protective fins 140 and second connector 141 in Embodiment 4.

The second protective fins 740 have the length in the first axis direction increased as their position goes up and their other end faces form a plane gradually protruding in the first axis positive direction at the same inclination as it goes up. As a result, the other end faces of the second protective fins 740 are positioned on a plane. It is preferable that the other end face of the second connector 741 is also positioned on the same plane as the other end faces of the second protective fins 740.

As a result, as in Modified Embodiments 1 and 2, damage to the first protective fins 735 and second protective fins 740 due to the flying objects such as deformation and missing can be reduced.

Embodiments of the present disclosure are described above. The present disclosure is not confined to the embodiments and includes any modes in which the embodiments are modified in various ways and the technical scope equivalent thereto.

INDUSTRIAL APPLICABILITY

The present disclosure can be used in the power conversion device for electric railroad vehicles such as Shinkansen (Bullet Trains) and conventional trains and the like.

REFERENCE SIGNS LIST 100, 200, 300, 400, 500, 600, 700 Vehicular power conversion device
110 Enclosure
111 Semiconductor element
112, 212, 312, 412, 512, 712 Cooler
120 Base
121 Radiator
122, 222, 322, 722 First protector
123, 223, 323, 723 Second protector
124 First fastener
125 Second fastener 130 Heat-radiating fin
131 Detachment preventer
135, 235, 335, 735 First protective fin
136, 736 First connector
137 First protective base
140, 240, 340, 740 Second protective fin
141, 741 Second connector
142 Second protective base
460 Tip end protector
461, 566 Slit
565 End fin protector

The invention claimed is:

1. A vehicular power conversion device, comprising:
semiconductor elements working for power conversion and generating heat;
a base having a first surface to which the semiconductor elements are connected for absorbing the heat transmitted from the semiconductor elements;
a plurality of heat-radiating fins arranged on a second surface of the base facing in an opposite direction as the first surface, and juxtaposed at intervals to form a passage in an axial direction, receiving the heat from the semiconductor elements, and expelling the heat into air flowing through the passage;
a first protective fin attached to the second surface of the base and including an end face having an equal length in the juxtaposition direction to and mutually facing one direction end face of at least some of the heat-radiating fins, and extending in the one direction from that end face, the first protective fin being removably attached to the second surface of the base from the plurality of heat-radiating fins; and
a second protective fin attached to the second surface of the base and including an end face having an equal length in the juxtaposition direction to and mutually facing the other direction end face of at least some of the heat-radiating fins, and extending in the other direction from that end face, the second protective fin being removably attached to the second surface of the base from the plurality of heat-radiating fins.

2. The vehicular power conversion device according to claim 1, wherein
a plurality of the first protective fins are provided, each including an end face having an equal length in the juxtaposition direction to and mutually facing the one direction end face of one of all heat-radiating fins, and extending in the one direction from that end face, and
a plurality of the second protective fins are provided, each including an end face having an equal length in the juxtaposition direction to and mutually facing the other direction end face of one of all heat-radiating fins, and extending in the other direction from that end face.

3. The vehicular power conversion device according to claim 1, further comprising:
a tip end protector disposed outside the plurality of heat-radiating fins on the tip side and connected to the first protective fins and second protective fins.

4. The vehicular power conversion device according to claim 3, wherein
the tip end protector has slits extending in the axial direction.

5. The vehicular power conversion device according to claim 1, further comprising:
an end fin protector disposed outside the plurality of heat-radiating fins on at least one end in the juxtaposition direction and connected to the first protective fin and second protective fin disposed on the at least one end in the juxtaposition direction.

6. The vehicular power conversion device according to claim 5, wherein
the end fin protector has slits extending in the axial direction.

7. The vehicular power conversion device according to claim 1,
wherein the second surface is a fin connection surface to which the heat-radiating fins are connected to transmit the heat to the heat-radiating fins, and transmitting the heat from the semiconductor connection surface to the fin connection surface.

8. The vehicular power conversion device according to claim 7, wherein
the one direction end faces of the plurality of first protective fins are positioned on a plane or curved plane gradually protruding in the one direction as it goes up when the tips of the first protective fins are oriented downward or sideways, and
the other direction end faces of the plurality of second protective fins are positioned on a plane or curved plane gradually protruding in the other direction as it goes up when the tips of the second protective fins are oriented downward or sideways.

9. The vehicular power conversion device according to claim 1, comprising:
a first protector disposed on an axial positive side of the heat-radiating fin for protecting the heat-radiating fin, the first protector including a first protective base attached to the second surface of the base by a first fastener and the first protective fin; and
a second protector disposed on an axial negative side of the heat-radiating fin for protecting the heat-radiating fin, the second protector including a second protective base attached to the second surface of the base by a second fastener and the second protective fin.

10. The vehicular power conversion device according to claim 9, wherein
the first fastener fastens the base to the vehicle body along with the first protective base; and
the second fastener fastens the base to the vehicle body along with the second protective base.

* * * * *